(12) United States Patent
Ryou et al.

(10) Patent No.: US 7,858,417 B2
(45) Date of Patent: Dec. 28, 2010

(54) DIELECTRIC VCSEL GAIN GUIDE

(75) Inventors: Jae-Hyun Ryou, Maple Grove, MN (US); Gyoungwon Park, Medina, MN (US)

(73) Assignee: Finisar Corporation, Sunnyvale, CA (US)

(*) Notice: Subject to any disclaimer, the term of this patent is extended or adjusted under 35 U.S.C. 154(b) by 2 days.

(21) Appl. No.: 11/866,297

(22) Filed: Oct. 2, 2007

(65) Prior Publication Data

US 2008/0020553 A1 Jan. 24, 2008

Related U.S. Application Data

(62) Division of application No. 10/607,629, filed on Jun. 27, 2003, now Pat. No. 7,277,461.

(51) Int. Cl.
*H01L 21/00* (2006.01)

(52) U.S. Cl. .................... 438/44; 438/46; 438/47; 257/E21.108

(58) Field of Classification Search ............ 438/478, 438/42, 44, 46, 47; 257/E21.108
See application file for complete search history.

(56) References Cited

U.S. PATENT DOCUMENTS

| | | | |
|---|---|---|---|
| 5,719,891 A | 2/1998 | Jewell | |
| 5,724,374 A | 3/1998 | Jewell | |
| 5,985,683 A | 11/1999 | Jewell | |
| 6,014,395 A | 1/2000 | Jewell | |
| 6,233,267 B1 | 5/2001 | Nurmikko | |
| 6,888,873 B2 * | 5/2005 | Kwon | 372/96 |

* cited by examiner

*Primary Examiner*—Michael Trinh
(74) *Attorney, Agent, or Firm*—Workman Nydegger

(57) ABSTRACT

A vertical cavity surface emitting laser having a dielectric gain guide. The gain guide may provide current confinement, device isolation and possibly optical confinement. The first mirror and an active region may be grown. A pattern may be placed on or near the active region. A dielectric material may be deposited on the pattern and the pattern may be removed resulting in a gain guide. Then a top mirror may be grown on the gain guide. This structure with the dielectric gain guide may have specific characteristics and/or additional features.

12 Claims, 6 Drawing Sheets

DIELECTRIC VCSEL GAIN GUIDE

CROSS-REFERENCE TO RELATED APPLICATIONS

This application is a division, and claims the benefit, of U.S. patent application Ser. No. 10/607,629, filed Jun. 27, 2003 entitled A DIELECTRIC VCSEL GAIN GUIDE, which is incorporated herein in its entirety.

BACKGROUND OF THE INVENTION

The invention pertains to laser light sources and particularly to vertical cavity surface emitting lasers. More particularly, the invention pertains to long wavelength lasers.

A vertical cavity surface emitting laser (VCSEL) may include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL may be driven by a current forced through the active region, typically achieved by providing a first contact on the reverse side of the substrate and a second contact on top of the second mirror stack. The first contact may instead be on top of the first mirror stack in a coplanar arrangement.

VCSEL mirror stacks are generally formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlAs/AlGaAs material system wherein the different refractive index of each layer of a pair may be, for example, achieved by altering the aluminum content in the layers. In some devices, the number of mirror pairs per stack may range from 20 to 60 to achieve a high percentage of reflectivity, depending on the difference between the refractive indices of the layers. A larger number of pairs may increase the percentage of reflected light.

In many VCSELs, conventional material systems may perform adequately. However, new products are being developed requiring VCSELs to emit light having long wavelengths. VCSELs emitting light having a long wavelength are of great interest in the optical telecommunications industry because of the low fiber dispersion at 1310 nanometers (nm) and the low fiber loss at 1550 nm. For instance, a long wavelength VCSEL may be obtained by using a structure having an InGaAs/InGaAsP (or InAlGaAs) active region. When an InGaAs/InGaAsP active region is used, an InP/InGaAsP (or InAlGaAs /InAlAs or InAlGaAs/InP) material system needs to be used for the mirror stacks in order to achieve a lattice match relative to the InP substrate. The lattice matching between the substrate and the layers should be substantially close to ensure a true single crystal film or layer growth.

In the InP material based system, it is difficult to achieve a suitable monolithic DBR -based mirror structure having a reasonable thickness because of the insignificant difference in the refractive indices in this material system. As a result, many layers, or mirror pairs, are needed in order to achieve useful reflectivity. Useful reflectivity may be 99.8 percent or greater. Numerous attempts have been made to address the problem of very thick mirror structures. One attempt included a wafer bonding technique in which a DBR mirror is grown on a separate substrate and bonded to the active region. This technique has had only limited success and also the interface defects density in the wafer fusion procedure causes potential reliability problems. Other approaches to making satisfactory long wavelength VCSELs have been fraught with one problem or another. For instance, lattice matched InP based mirrors used for 1550 nm VCSELs have a host of problems in growth, processing, and optical performance. The low index contrast of InGaAsP (or InAlGaAs) and InP (or InAlAs) leads to the requirement of extremely thick (ten microns or thicker) DBRs of 45 or more mirror periods or layer pairs. The AlGaAsSb or AlGaPSb systems associated with an InP substrate may be difficult to grow by MOCVD, and with good contrast, may still require at least 25 mirror pairs to achieve adequate reflectivity for VCSEL operation. For some VCSEL structures, such as those having a long wavelength, current confinement is an important characteristic. Proton implantation and lateral oxidation have been developed and used for current confinement in vertical cavity surface emitting lasers (VCSELs), especially GaAs-based VCSELs. For some VCSELs, however, proton implantation and lateral oxidation cannot be easily applicable due to either very thick top DBR stacks for proton implantation or lack of lattice-matched high aluminum containing material for oxidation, respectively. This is particularly the case of InP related materials for long wavelength VCSEL operation. For InP based material systems, since index contrasts are relatively small as compared to GaAs based counterparts, the DBR stacks tend to be much thicker to provide reasonable reflectivity. Consequently, large amounts of energy are required for gain guide proton implantation, which is not practical. Such energy levels may damage other parts of the structure. Also, the aluminum content is significantly lower in materials lattice matched to InP substrates than in those materials lattice matched to GaAs substrates. The low aluminum content makes lateral oxidation difficult. Thus, an alternative to implantation and oxidation for making a gain guide is needed. The invention provides that alternative.

BRIEF SUMMARY OF THE INVENTION

The invention may involve a vertical cavity surface emitting laser having an InP substrate, a first mirror situated on the substrate, an active region situated on the first mirror, a gain guide formed on the active region and a second mirror situated on the gain guide.

To circumvent the problems indicated above, a dielectric layer can be used as a gain guide by depositing a dielectric material such as silicon oxide, silicon nitride, or the like, in an appropriate pattern between the cavity and top DBR. The dielectric layer can be used not only for current confinement but also for optical confinement if a proper dielectric material is chosen.

If an epitaxial growing mechanism is also equipped with a dielectric material deposition tool, both epitaxial semiconductor and dielectric layers may be grown in one step. However, many semiconductor epitaxial growth mechanisms or tools are not capable of depositing dielectric materials. Also, patterning may be required before the dielectric material deposition. The over growth technique may be applicable to inserting a dielectric layer between the semiconductor layers. First, bottom DBRs and a cavity/active layer may be grown on a substrate. The epitaxial growth may be interrupted and a dielectric material layer deposited on the semiconductor layers, followed by patterning. The patterned sample may then be loaded back to the chamber for top DBR growth. Over growth may occur on a semiconductor surface and then on a dielectric surface by a lateral epitaxial over growth.

DETAILED DESCRIPTION OF THE PREFERRED EMBODIMENTS

Figure 1:
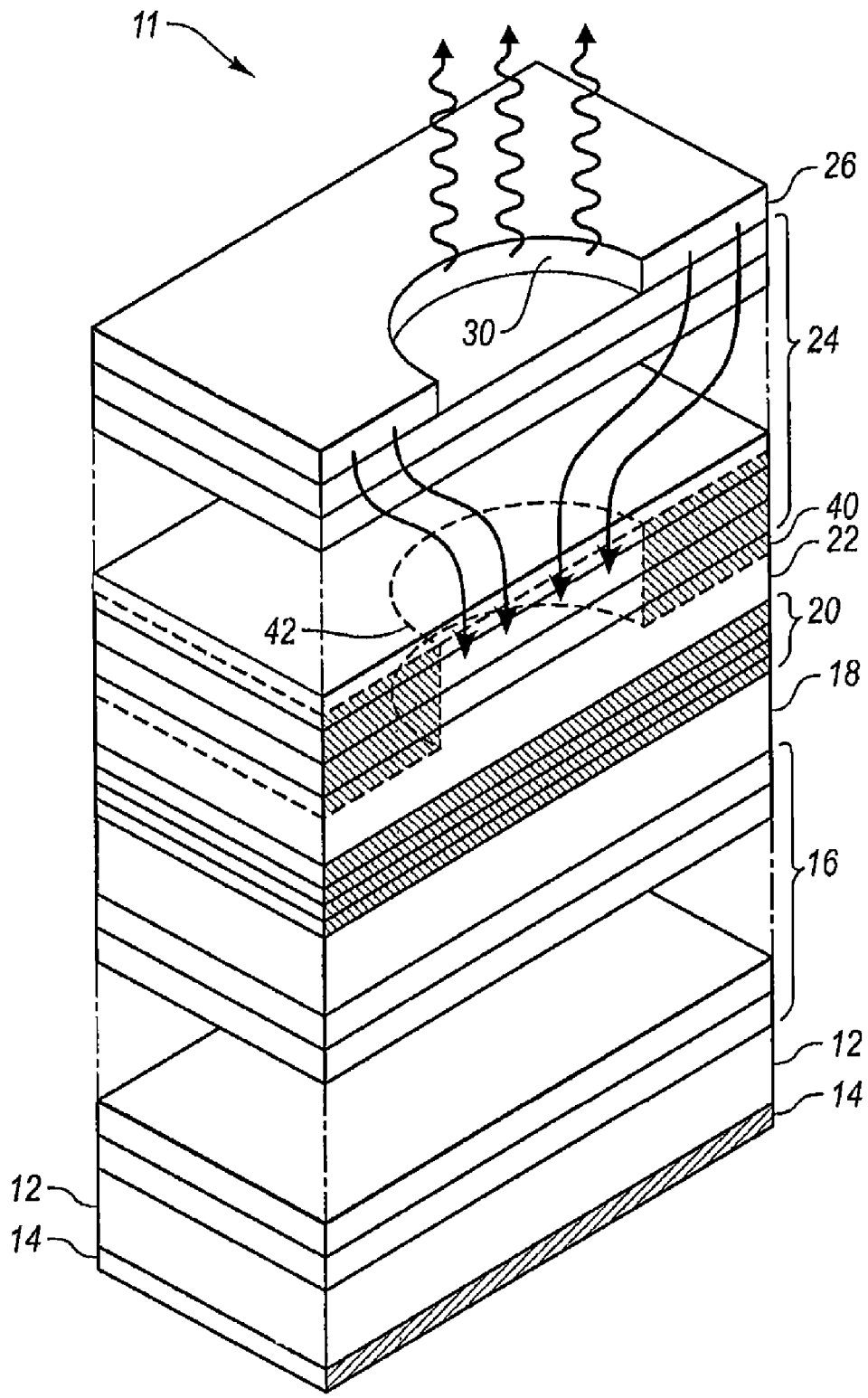
FIG. 1 illustrates a vertical cavity surface emitting laser (VCSEL)

FIG. 1 is a representation showing a perspective illustration of a structure for a vertical cavity surface emitting laser 11. A substrate 12 may be disposed on an electrical contact 14. A first mirror stack 16 and a bottom graded index region 18 may be progressively disposed, in layers, on substrate 12. A quantum well active region 20 may be formed and a top graded index region 22 may be disposed over active region 20. A top mirror stack 24 may be formed over the active region and a conductivity layer 26 may form an electrical contact. Current may flow from upper contact 26 to lower contact 14. This current may pass through active region 20. Upward arrows in FIG. 1 illustrate the passage of light through an aperture 30 in upper contact 26. The downward arrows illustrate the passage of current downward from upper contact 26 through upper mirror stack 24 and the active region 20. An ion (proton) implantation 40 may form an annular region of electrically resistant material. A central opening 42 of electrically conductive material may remain undamaged during the ion (proton) implantation process. As a result, current passing from upper contact 26 to lower contact 14 may be forced to flow through conductive opening 42 and thereby be selectively directed to pass through a preselected portion of active region 20. The current may flow through bottom mirror stack 16 and substrate 12 to lower contact 14. The current going through active region 20 may result in a generation of light with in a cavity constituted between top and bottom mirrors 16 and 24. Light may be eventually emitted by structure 11 out of aperture 30 as shown by the upward pointing arrows.

Figure 2:
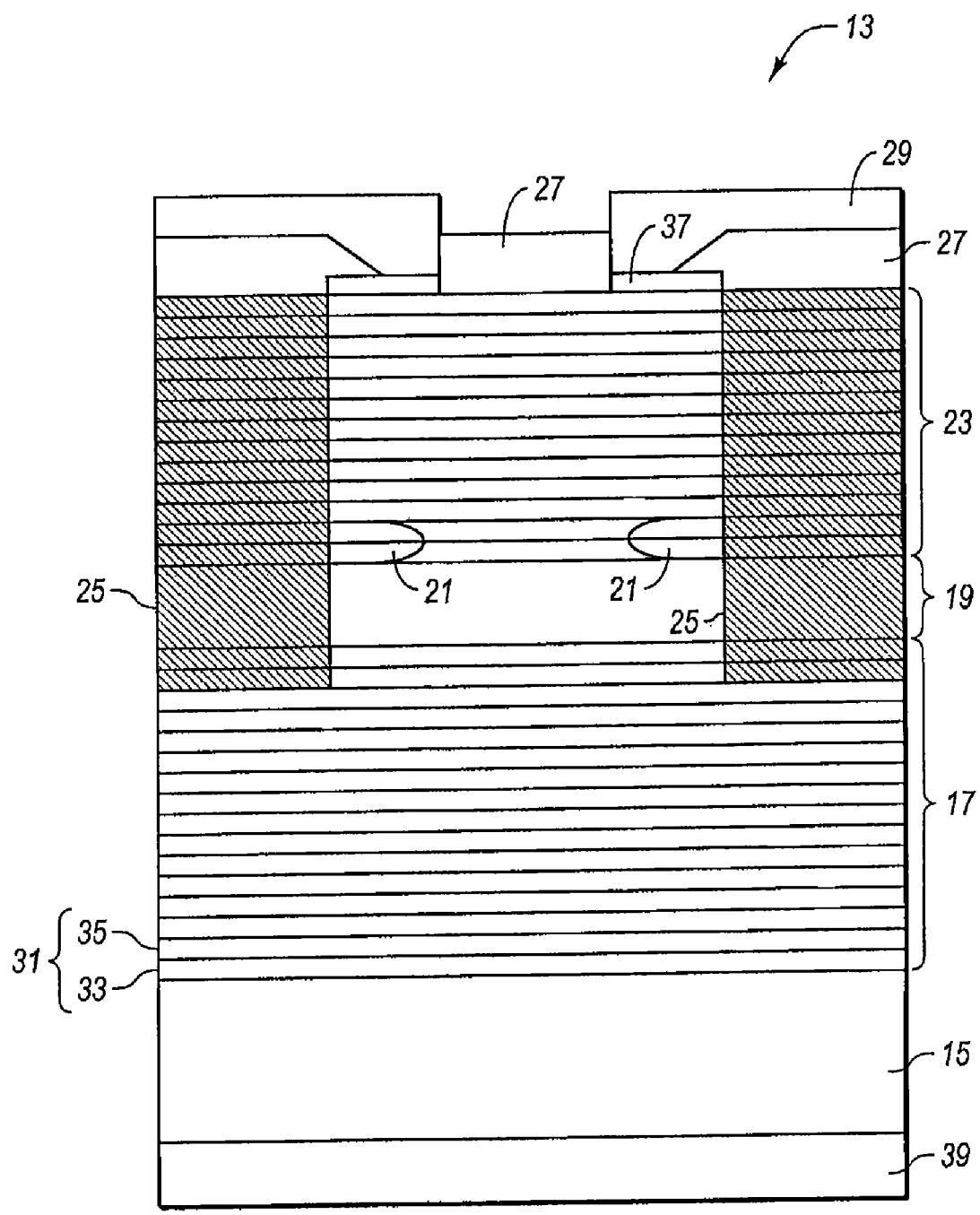
FIG. 2 reveals an illustrative example of a long wavelength InP material based VCSEL.
Figure 3:
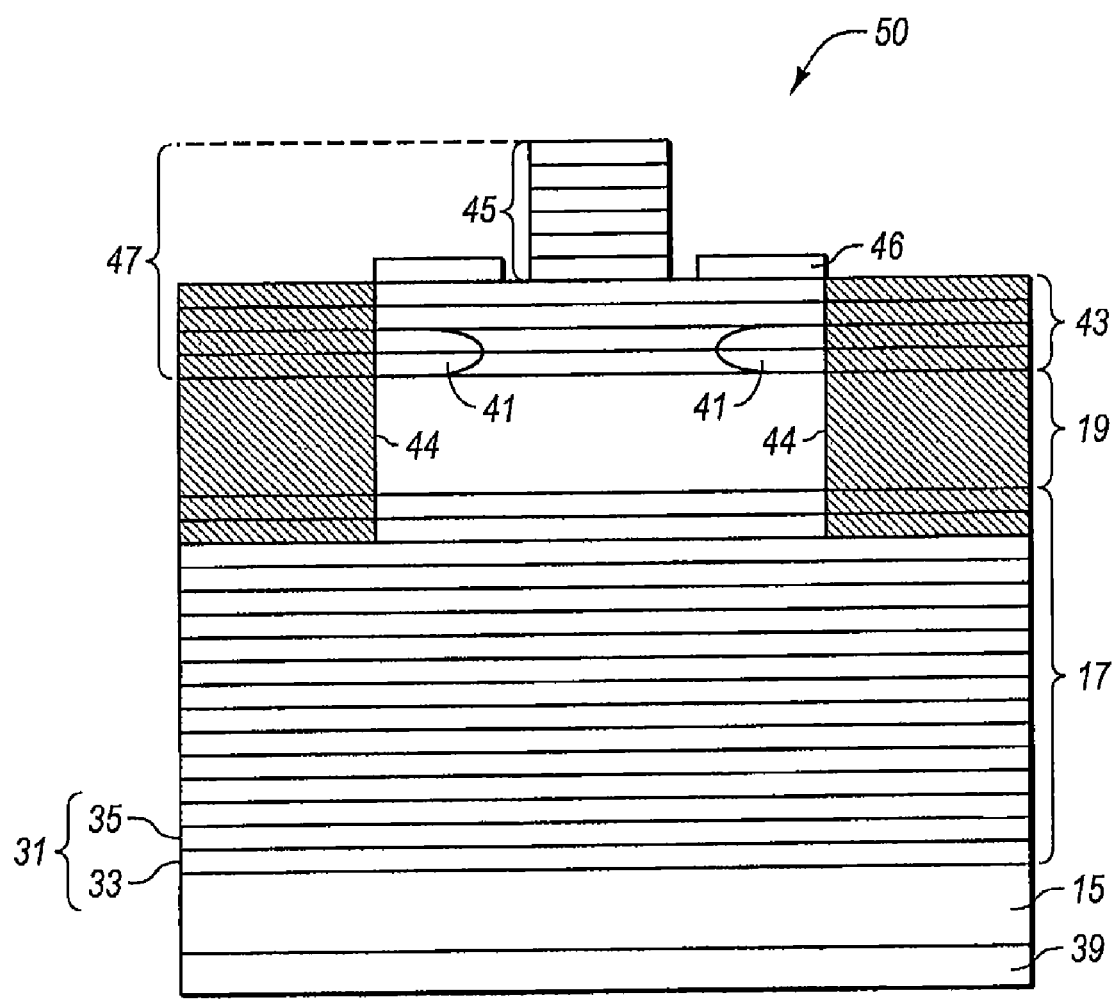
FIG. 3 reveals a VCSEL structure having a two part top mirror with proton implantation effected through just the lower part of the top mirror.
Figure 4:
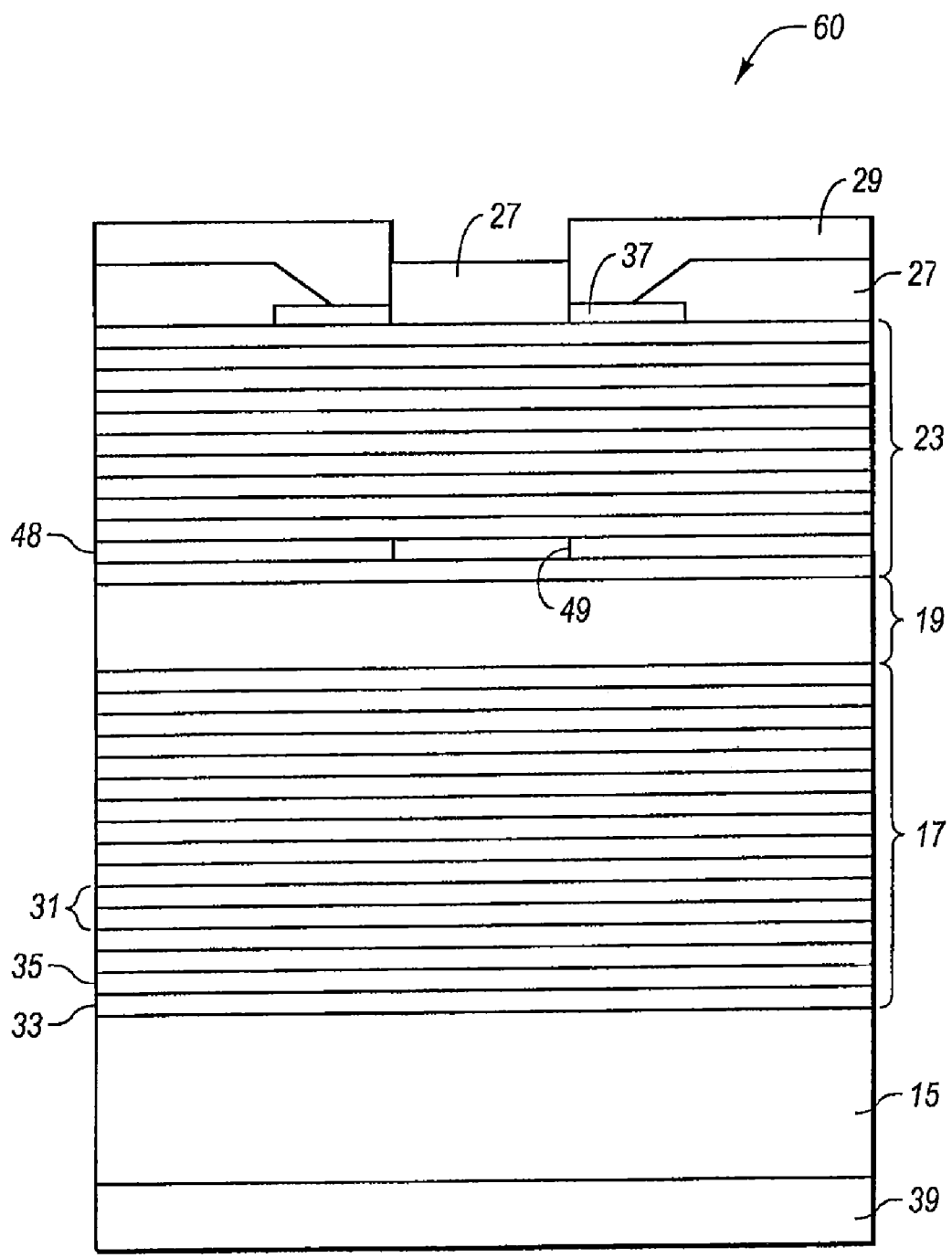
FIG. 4 shows a VCSEL structure utilizing lateral oxidation in at least one aluminum-containing layer in the top mirror for device isolation and current confinement.

FIGS. 2, 3 and 4 reveal several illustrative examples of long wavelength InP based VCSEL structures. A long wavelength may range from about 1200 nm through about 1800 nm. FIGS. 2, 3 and 4 are not necessarily drawn to scale. Structure 13 of FIG. 2 may be a full epitaxial proton implantation version. It may have an InP substrate 15. On substrate may be formed a lower or bottom mirror 17. Mirror 17 may be a distributed Bragg reflector (DBR) having a stack of pairs 31 of layers 33 and 35 of materials. Each pair 31 may be one-half wavelength thick. Each of the layers 33 and 35 may be one-fourth wavelength thick. The thicknesses may be optical wavelengths of the light emitted from structure 13, for the respective materials of layers 33 and 35. The two layers, 33 and 35, of each pair 31 may be composed of different materials. For example, layer 33 may be InAlGaAs and layer 35 may be InAlAs. These layers and pairs may be repeated in a mirror stack. Other pairs of materials for layers 33 and 35 may include InGaAsP and InP, InAlGaAs and InP, GaAsSb and AlAsSb, and GaAsSb and InP, respectively. There may also be other material pairs that may be appropriate for making DBR mirror 17.

Situated on bottom mirror 17, may be formed an active region or cavity 19. Region 19 may have between one and more than five quantum wells. The material for the active region may be InGaAs (or InAlGaAs with low Al content) for quantum wells and InAlGaAs with high Al content for barriers. On active region 19 may be formed an upper or top mirror 23. DBR mirror 23 may have the same structure of pairs 31 of layers 33 and 35 as that in bottom mirror 17.

Proton implantation may be applied at the lower part of mirror 23 to make a gain guide 21 to provide current guidance and confinement in VCSEL structure 13. A center portion on the top of mirror 23 may be masked with a material resistant to proton implantation. Then a proton implantation may be applied to the top of structure 13 resulting in an isolation 25. Since the indexes of refraction of each material of the pairs of layers are close to each other, then many more pairs 31 may be required to build the mirror with the needed 99.8 percent reflectivity. Consequently, top mirror is a quite thick epitaxial DBR. Thus, rather high energy is required to achieve proton implantation down far enough in mirror 23 to result in an effective isolation 25.

The mask may be removed from the central portion of top mirror 23. Another mask may be applied to the top mirror 23 with an opening for applying a contact metal 37 on the top of mirror 23. Structure 13 may be moved so the resultant contact metal 37 may be in the form of a ring. The mask may be removed after deposition for the contact metal 37. Another mask may be placed on a portion of the contact metal and a passivation layer 27 may be deposited on the top of structure 13. The mask may be removed and another mask may be formed on the center portion of passivation layer 27. A layer of contact metal may be applied on the masked top of structure 13. The mask from the center portion of passivation layer may be removed with the remaining contact metal resulting in a ring-like contact 29 connected to contact metal 37. Contact metal may be deposited on the bottom side of substrate 15 to result in a second contact 39 for VCSEL structure 13.

FIG. 3 shows a VCSEL structure 50 which may a regarded as a hybrid proton implantation version. As like structure 13 of FIG. 2, a mirror 17 may be formed on an InP substrate 15. The structure and materials used in the pairs 31 of layers 33 and 35 may be the same as those in structure 13. An active region on cavity 19, like that of structure 13, may be formed on mirror 17. An active region or cavity 19 may be formed on bottom mirror 17. On cavity 19, a first part 43 of mirror 47 may be formed on active layer or cavity 19. The material of pairs 31 of mirror part 43 may be the same as the pairs of bottom mirror 17 of this structure 50.

Proton implantation may be applied in a lower portion of mirror part 43 to make a gain guide 41 to provide current guidance and confinement in VCSEL structure 50.

Mirror part 43 may have fewer pairs 31 of layers 33 and 35 than bottom mirror 17 of this structure 50 or top mirror 23 of structure 13. One reason for the shorter mirror stack 43 may be to effect a proton implantation result in an isolation 44 requiring much less energy than the proton implantation required for making isolation 25 in structure 13.

On mirror part 43, another mirror part 45 may be formed. Mirror parts 43 and 45 constitute upper DBR mirror 47. Mirror part 45 is a dielectric mirror stack (DBR) 45 may be like a mesa or an island situated on lower mirror part or portion 43 of upper mirror 47. Mirror stack 45 may have, as examples, 3 to 4 pairs of $TiO_2$ and $SiO_2$, 2 to 3 pairs of Si and $Al_2O_3$, or 4 to 5 pairs of $TiO_2$ and $Al_2O_3$, respectively. The dielectric stack may cover the light aperture of VCSEL structure 50 and not block emitted light.

Formed around dielectric stack 45 may be a ring 46 of contact metal as a first contact 46 for VCSEL structure 50. Contact 46 may be deposited in a manner similar to that of contact 37 for structure 13. A second contact metal may be deposited on the bottom of InP substrate 15 as a second contact 39 for VCSEL structure 50. A disadvantage of structure 50 is the process for making it is complicated with stack 45 and related issues such as, for instance, stress in dielectric DBR stack 45.

FIG. 4 shows VCSEL structure 60 which may be regarded as a full epitaxial oxide version. Lateral oxidation in upper mirror 23 is resorted to for isolation and current confinement. On InP substrate 15, a DBR mirror 17 may be formed. Mirror 17 may have a stack of pairs 31 of layers 33 and 35 having material like that of mirror 17 in structure 13. An active region or cavity 19 may be formed on bottom DBR mirror 17. Active region 19 may have one to more than five quantum wells. The material of active region 19 may include material similar to that of region 19 in structure 13. A top mirror 23 may be formed on active region or cavity 19. Mirror 23 has a structure of pairs of layers of material like that of mirror 23 in structure 13. One thing different from structure 13 is that one or two of the layers of a pair 31, near active region 19 in mirror 23, may have a high content of aluminum. In other words, these layers are oxidizable and may be oxidized laterally under certain environmental conditions such as high water vapor and temperature. The result may be lateral oxidation 48 forming a gain guide 49 and providing isolation for VCSEL structure 60. Isolation 25 and a gain guide 49 as provided by proton implantation in structure 13 may be absent in structure 60. Contact metal 37 and passivation layer 27 are formed on the top of upper DBR mirror 23 in the same manner as it is formed for structure 13. An electrical contact 29, connected to contact metal 37, is made in the same manner as that for structure 13. Contact material may be deposited on the bottom of InP substrate 15 to provide a second electrical contact for VCSEL structure 60. One disadvantage relative to making the structure 60 version is the lack of ease of producing an appropriate lateral oxidation 48 to provide the desired gain guide 49.

Figure 5:
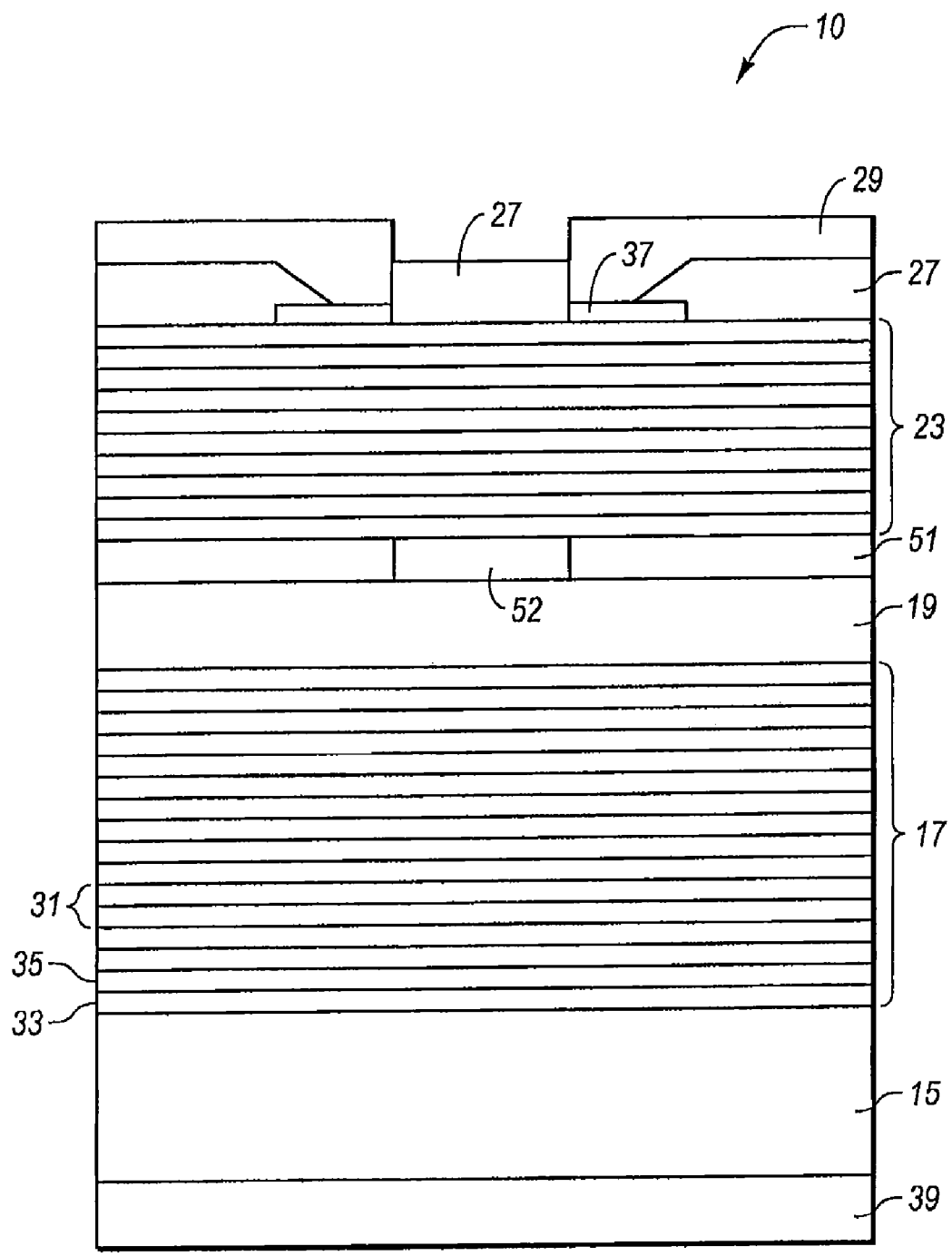
FIG. 5 reveals a VCSEL structure having a dielectric gain guide.

FIG. 5 reveals a VCSEL structure 10 having a dielectric gain guide 51. On an InP substrate 15 may be a bottom DBR mirror 17 having pairs 31 of layers 31 and 33 made in the same manner and having the same structure as that of structure 13. An active region or cavity 19 may be grown or formed on top of bottom mirror 17. Active region or cavity 19 may have the same materials and structure as the region or cavity 19 in structure 13. A gain guide having a pattern may be deposited on active region or cavity 19. The pattern may be for an aperture for current confinement and optical confinement. The pattern may be determined with a mask on active region or cavity 19. The material for dielectric gain guide 51 may be $SiO_2$, $TiO_2$, SiN and other appropriate dielectric materials. The deposition of dielectric material for gain guide 51 may be done between two epitaxial growths.

Figure 6A:
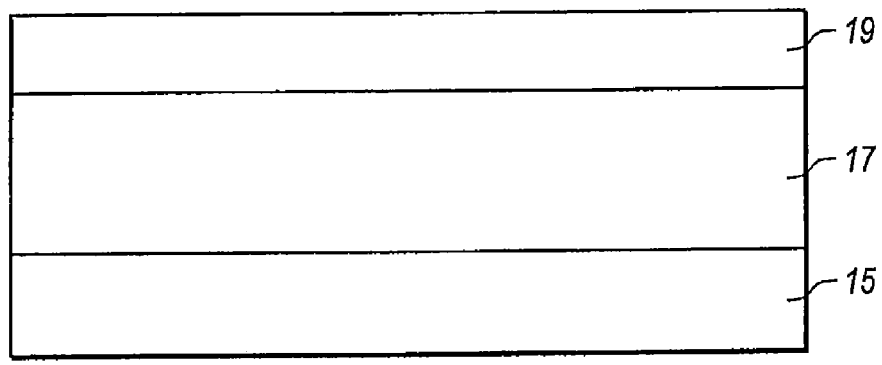
FIGS. 6a, 6b and 6c show a summary of stages for making a dielectric gain guide.
Figure 6B:
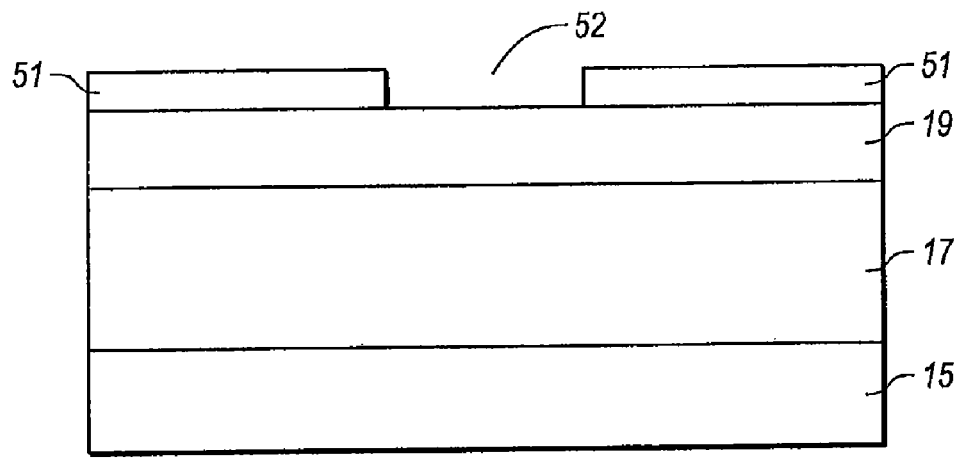
Figure 6C:
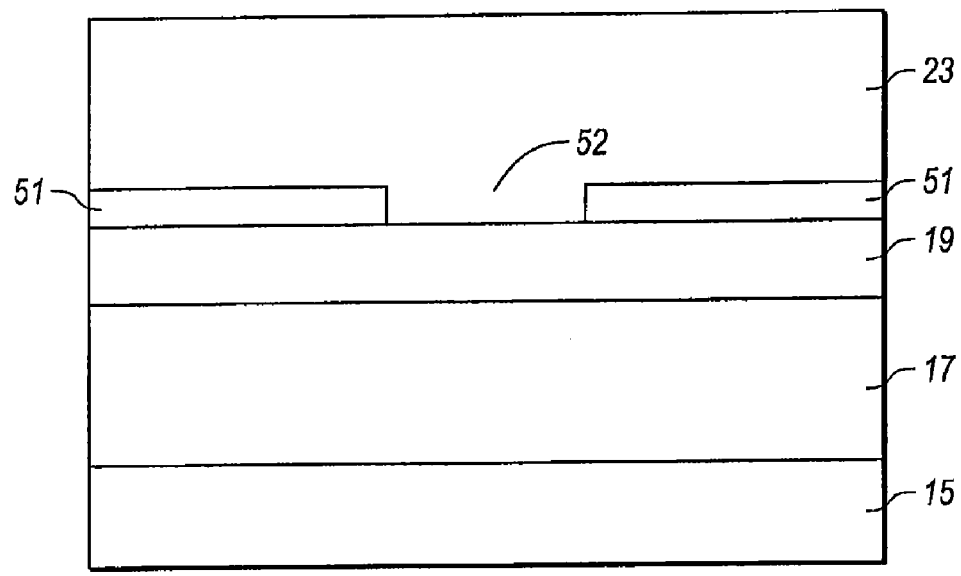

FIGS. 6a, 6b and 6c reveal the basic steps of the process for obtaining a dielectric gain guide in a VCSEL structure. The details of the structure may be noted in the preceding figures. First, as in FIG. 6a, may be a growth of the bottom mirror 17 on substrate 15. Active region and/or cavity 19 may be grown on bottom DBR mirror 17. Then one may mask cavity 19 in the area of an aperture 52 to use lift-off technique or deposit the dielectric and place a mask on the dielectric to etch out an aperture 52. FIG. 6b shows the results of the gain guide 51 masking and deposition. Upon depositing dielectric gain guide 51 layer and making aperture 52, then top DBR mirror 23 may be grown on layer 51 and active region 19 in aperture area 52, as shown in FIG. 6c. Aperture 52 or gain guide 51 may provide current and optical confinement. Optical confinement may not be needed. In summary, there may be the epitaxial growth in FIG. 6a, the dielectric deposition (and patterning) in FIG. 6b, and another epitaxial growth of the top DBR mirror 23. The growth of mirror 23 may be regarded as an over-growth. The dielectric deposition is between two epitaxial growths.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A method for making a gain guide for a long wavelength VCSEL comprising:
   forming a first mirror above a substrate;
   forming an active region above said first mirror, the active region including In and being configured to emit light at a long wavelength in a range from about 1200 nanometers to about 1800 nanometers;
   depositing a mask and a dielectric material above the active region, wherein the mask provides a pattern for forming an aperture in the dielectric material;
   forming an aperture in the dielectric material according to the mask so as to form a dielectric gain guide; and
   forming a second mirror above said dielectric gain guide, wherein a layer of the at least one of the first and second mirrors comprises In.

2. The method of claim 1, wherein the dielectric material comprises at least one of $SiO_2$, $TiO_2$, or SiN.

3. The method of claim 1, wherein the first and second mirrors are distributed Bragg reflectors.

4. The method of claim 1, wherein the substrate comprises InP.

5. A method as in claim 1 wherein the aperture is formed using a lift off technique.

6. A method as in claim 1 wherein the aperture is formed by etching a portion of the dielectric material.

7. The method of claim 1, wherein the at least one of the first and second mirrors includes an InGaAsP layer and an InP layer.

8. The method of claim 1, wherein the at least one of the first and second mirrors includes an InAlGaAs layer and an InP layer.

9. The method of claim 1, wherein the at least one of the first and second mirrors includes an GaAsSb layer and an InP layer.

10. A method for manufacturing a long wavelength laser source comprising:
    forming a first reflector;
    forming a cavity situated above said first reflector, the cavity including In and being configured to emit light at a long wavelength in a range from about 1200 nanometers to about 1800 nanometers;
    forming a layer of dielectric, having an opening formed therein, the layer of dielectric formed using a dielectric deposition process including a masking technique, the layer of dielectric situated above said cavity, wherein the layer of dielectric includes at least one material selected from of a group of SiO2, TiO2, and SiN;

forming a second reflector situated above said layer, wherein the first reflector, the cavity and the second reflector are formed using an epitaxial growth process, wherein a layer of the at least one of the first and second reflectors comprises In.

11. The method of claim 10, wherein said first reflector is situated on a substrate.

12. The method of claim 9, wherein the laser source has an InP based structure.

\* \* \* \* \*